United States Patent [19]
Chen et al.

[11] Patent Number: 6,057,202
[45] Date of Patent: May 2, 2000

[54] METHOD FOR MANUFACTURING AN INDUCTOR WITH RESONANT FREQUENCY AND Q VALUE INCREASED IN SEMICONDUCTOR PROCESS

[75] Inventors: Tzong-Liang Chen; Kuan-Ting Chen, both of Hsinchu; Chih-Ming Chen, Tainan Hsien; Hao-Chien Yung, Hsinchu, all of Taiwan

[73] Assignee: Windbond Electronics Corp., Hsinchu, Taiwan

[21] Appl. No.: 09/034,947

[22] Filed: Mar. 5, 1998

[30] Foreign Application Priority Data

Jan. 16, 1998 [TW] Taiwan ................................. 87100582

[51] Int. Cl.⁷ ................................................. H01L 21/20
[52] U.S. Cl. ........................... 438/381; 438/238; 438/393; 438/411; 438/421; 438/619; 257/531; 336/165
[58] Field of Search ..................................... 438/381, 393, 438/619, 238, 411, 421, FOR 430, FOR 438; 257/531, 528, 532; 336/200, 232, 165, 178

[56] References Cited

U.S. PATENT DOCUMENTS

| | | | |
|---|---|---|---|
| 5,461,003 | 10/1995 | Havemann et al. | 438/666 |
| 5,760,456 | 6/1998 | Grzegorek et al. | 257/531 |
| 5,953,625 | 9/1999 | Bang | 438/619 |

*Primary Examiner*—Carl Whitehead, Jr.
*Assistant Examiner*—Jamie L. Davis
*Attorney, Agent, or Firm*—Birch, Stewart, Kolasch & Birch, LLP

[57] ABSTRACT

A method for manufacturing an inductor with resonant frequency and Q value increased in semiconductor process can reduce substrate coupling effect, because (an) air layer (s) is/are formed just under a spiral metal layer which functions as an inductor. In addition, part of the substrate material still remains around the air layer(s), which can be used as a support for the spiral metal layer. Therefore, a problem causing the above-mentioned spiral metal layer to collapse will never occur.

22 Claims, 8 Drawing Sheets

METHOD FOR MANUFACTURING AN INDUCTOR WITH RESONANT FREQUENCY AND Q VALUE INCREASED IN SEMICONDUCTOR PROCESS

BACKGROUND OF THE INVENTION

1. Field of the Invention

The invention relates to a method for manufacturing semiconductors, and in particular to a method for manufacturing an inductor with resonant frequency and Q value increased in semiconductor process.

2. Description of the Prior Art

In the prior art, a spiral metal layer functioning as an inductor is typically formed over a field oxide layer. As shown in FIG. 1, a perspective view shows a structure of an inductor manufactured in semiconductor process according to the prior art, wherein reference numerals 10, 11, 12 and 18 indicate substrate, field oxide, dielectric layer and spiral metal layer, respectively. Even though this structure for manufacturing an inductor is really simply, this inductor formed based on this structure has high substrate coupling effect, resulting in reducing resonant frequency and Q value thereof.

For solving the above-mentioned problem, another method for manufacturing an inductor with high resonant frequency and Q value in semiconductor process is disclosed. As shown in FIG. 2, a structure of another inductor manufactured in semiconductor process according to the prior art is shown, wherein reference numerals 10, 11, 12, 13 and 18 represent substrate, field oxide, dielectric layer, air layer and spiral metal layer, respectively. The air layer 13 formed under the spiral metal layer 18 which serves as an inductor, can reduce substrate coupling effect, and thereby the resonant frequency and Q value of the inductor are raised. Due to the existence of the air layer 13, however, the upper layer, the spiral metal layer 18, cannot obtain an efficient support, causing the spiral metal layer 18 easily to collapse.

SUMMARY OF THE INVENTION

In view of the above, the object of the invention is to provide a method for manufacturing an inductor with resonant frequency and Q value increased in semiconductor process. This method according to the invention comprises the following steps. First, a substrate on which a plurality of field oxide layers are already formed, is prepared. A first dielectric layer is formed on the substrate and the plurality of field oxide layers. After that, a CMP process is performed for the first dielectric layer. A plurality of trenches are formed in the first dielectric layer and the substrate between the field oxide layers. A stuffing layer is formed on the first dielectric layer and in the plurality of trenches. Then, a CMP process is performed for the stuffing layer to remove part of the stuffing layer over the first dielectric layer, that is, remaining stuffing layers are still located only in the plurality of trenches. A second dielectric layer is formed on the first dielectric layer and remaining stuffing layers. Thereafter, a plurality of small trenches corresponding to the plurality of trenches are formed on the second dielectric layer. The remaining stuffing layers in the plurality of trenches are removed. A third dielectric layer with high viscosity is formed on the second dielectric layer, wherein the third dielectric layer during the formation cannot flow into the plurality of trenches because of the high viscosity of the third dielectric layer and tiny sizes of the plurality of small trenches. Finally, a spiral metal layer on the third dielectric layer is formed just over the plurality of trenches.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Referring to FIG. 3, a method for manufacturing aninductor with high resonant frequency and Q value in semiconductor process according to a first embodiment of the invention is shown. This method comprises the following steps.

Figure 1:
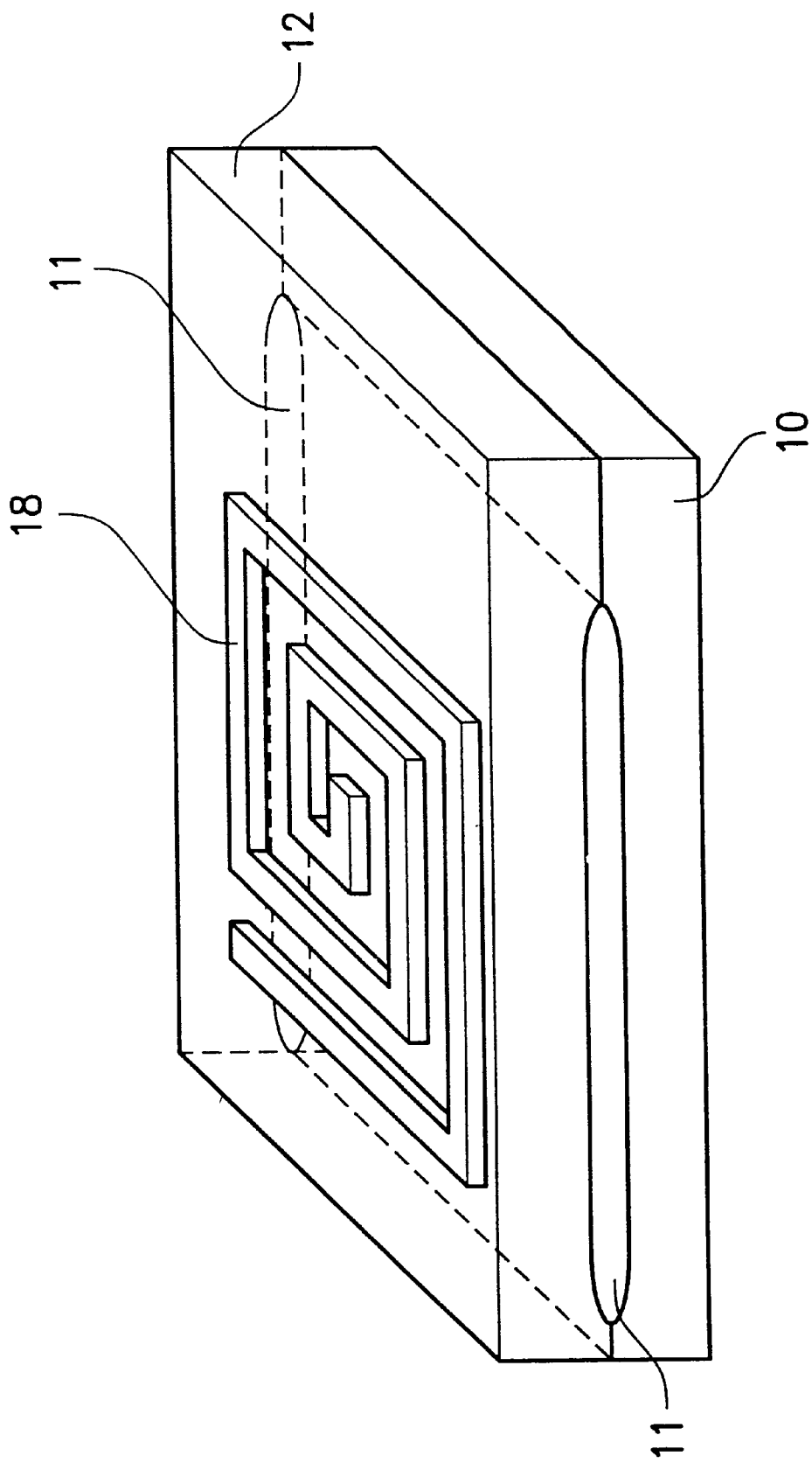
FIG. 1 is a perspective view illustrating a structure for manufacturing an inductor in semiconductor process according to the prior art.
Figure 2:
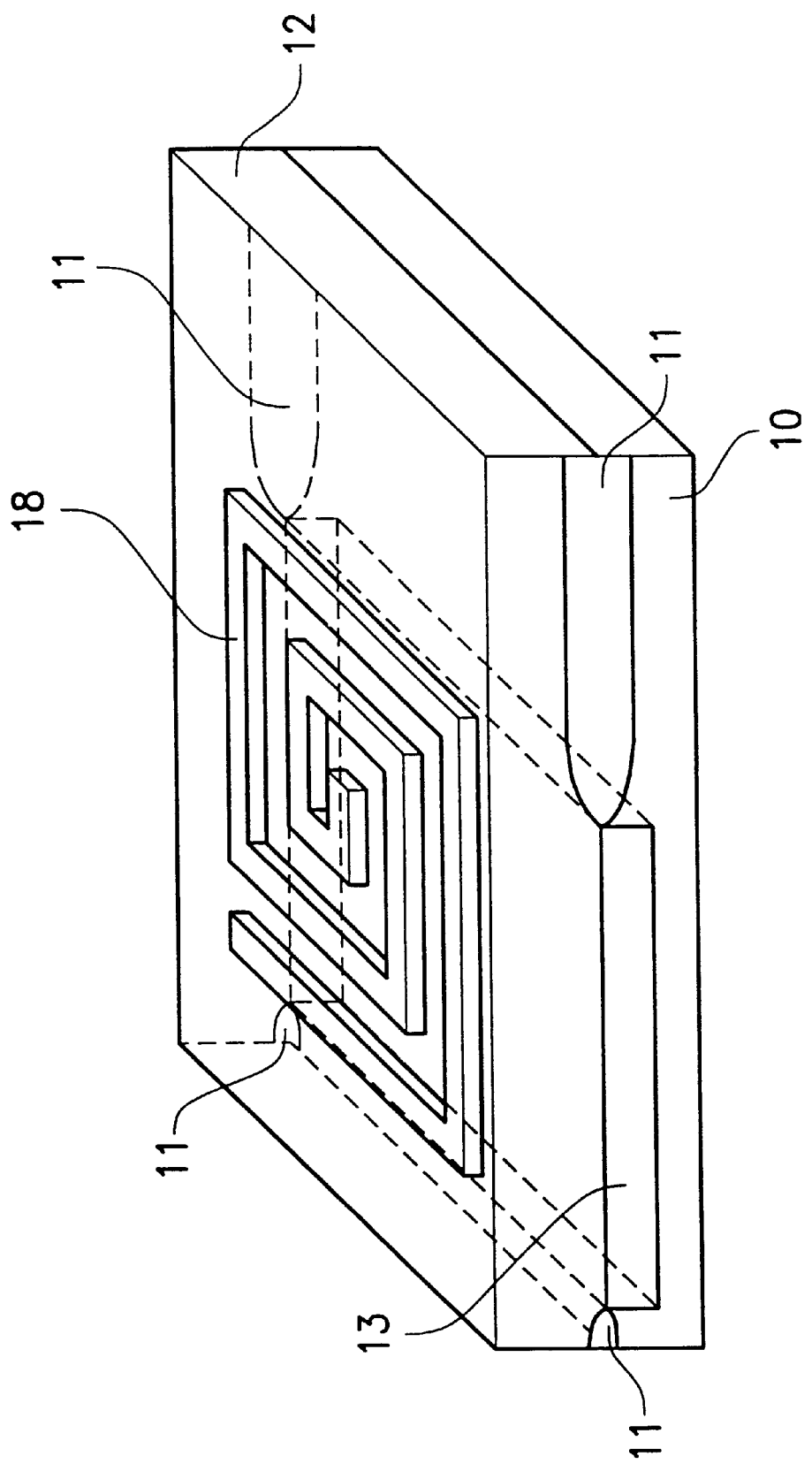
FIG. 2 is a perspective view illustrating a structure for manufacturing another inductor in semiconductor process according to the prior art.
Figure 3A:
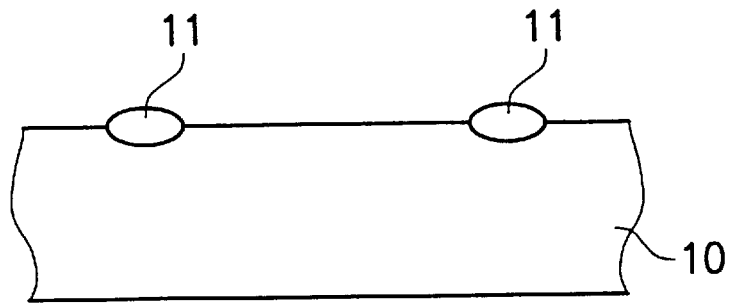
FIGS. 3A~3K are cross-sectional views illustrating a method for manufacturing an inductor in semiconductor process according to a first embodiment of the invention.

Step 1:

As shown in FIG. 3A, a substrate 10 on which a plurality of field oxide layers 11 (only two of them are shown) are already formed, is prepared.

Figure 3B:
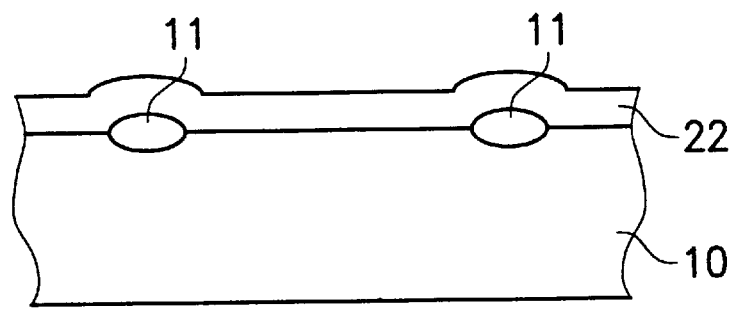

Step 2:

As shown in FIG. 3B, a first dielectric layer 22, such as silicon dioxide, is formed on the substrate 10 and the field oxide layers 11.

Figure 3C:
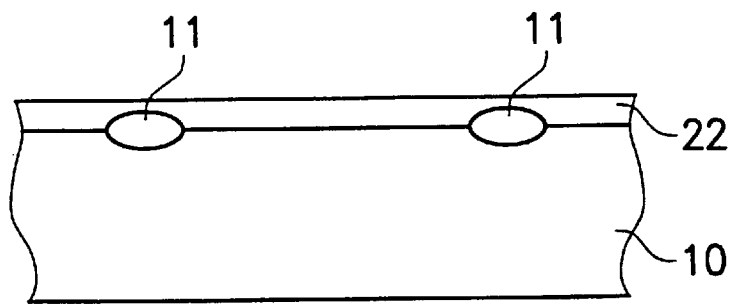

Step 3:

As shown in FIG. 3C, a CMP process is performed to planarize the first dielectric layer 22.

Figure 3D:
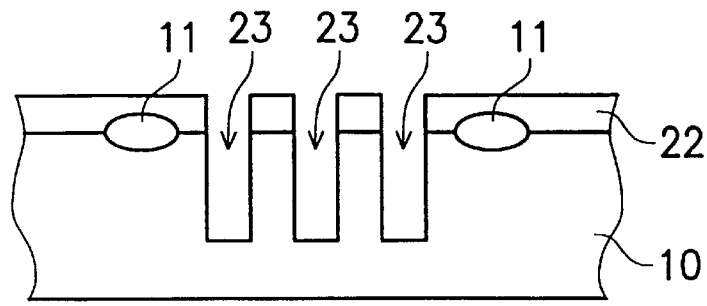

Step 4:

As shown in FIG. 3D, a plurality of trenches 23 are formed in the first dielectric layer 22 and the substrate 10 between the field oxide layers 11.

Figure 3E:
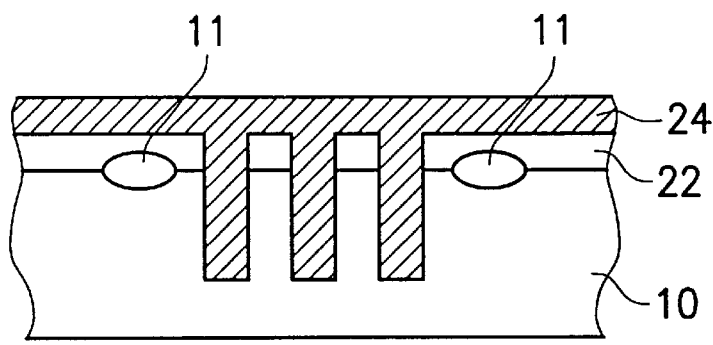

Step 5:

As shown in FIG. 3E, a stuffing layer 24, such as silicon nitride ($Si_3N_4$), is formed on the first dielectric layer 22 and in the plurality of trenches 23.

Figure 3F:
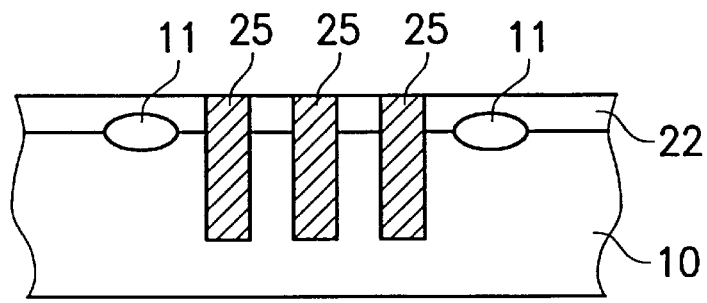

Step 6:

As shown in FIG. 3F, a CMP process is performed for the silicon nitride layer 24 to remove part of the silicon nitride layer 24 over the surface of the first dielectric layer 22. That is, remaining silicon nitride layers 25 are still located only in the plurality of trenches 23.

Figure 3G:
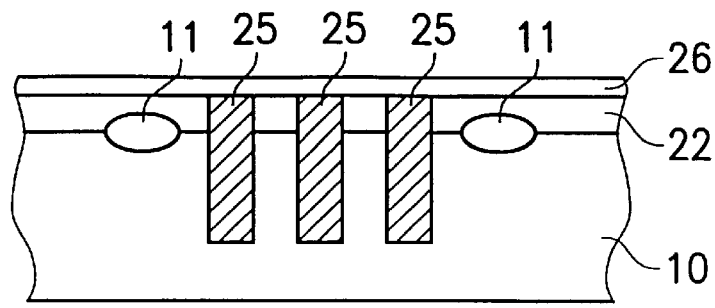

Step 7:

As shown in FIG. 3G, a second dielectric layer 26, such as silicon dioxide, is formed on the first dielectric layer 22 and the remaining silicon nitride layer 25 by use of a CVD process.

Figure 3H:
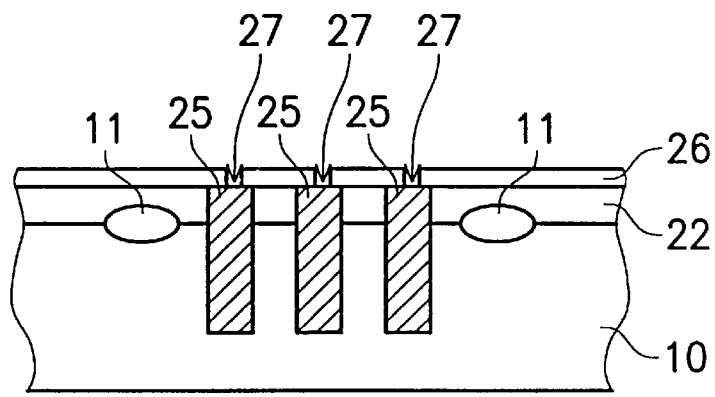

Step 8:

As shown in FIG. 3H, a plurality of small trenches 27 corresponding to the remaining silicon nitride layers 25 are formed on the second dielectric layer 26 by use of photolithography and plasma etching technologies.

Figure 3I:
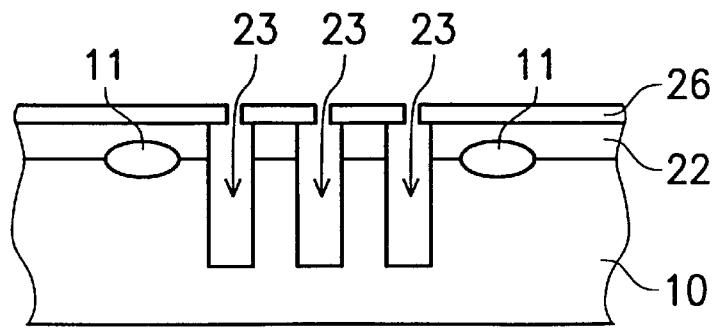

Step 9:

As shown in FIG. 3I, the remaining silicon nitride layers 25 in the plurality of trenches 23 are removed via the plurality of small trenches 27 by use of hot phosphatidic acid ($H_3PO_4$)

Figure 3J:
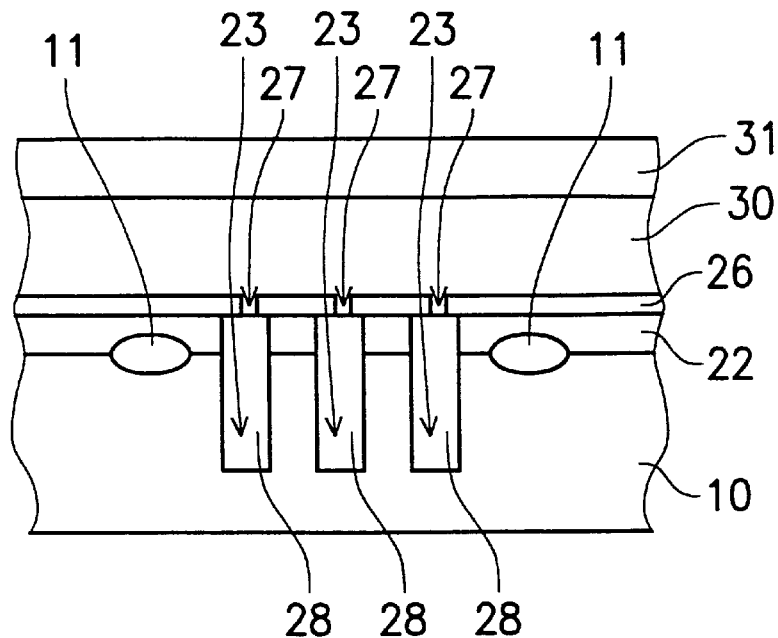
Figure 4:
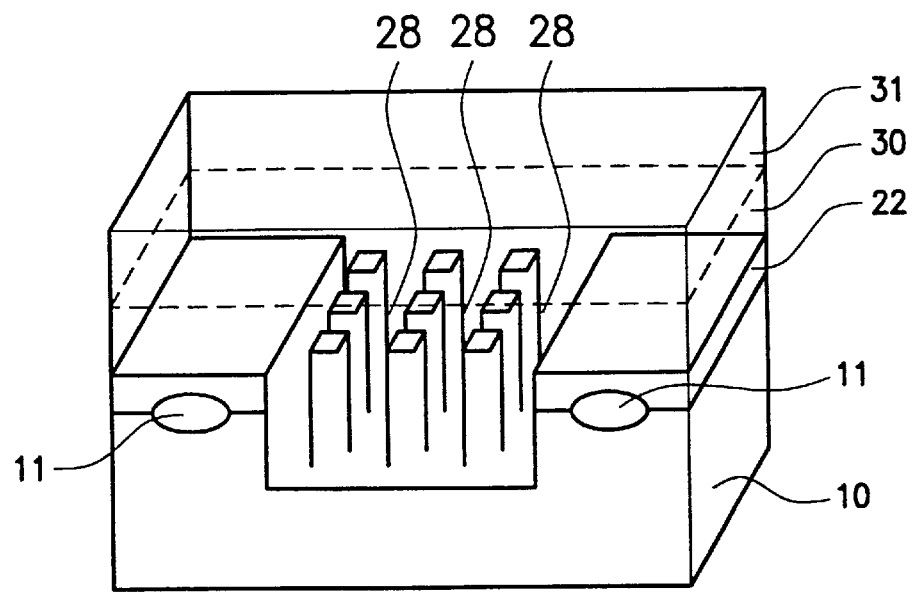
FIG. 4 is a perspective view of FIG. 3J.

Step 10:

As shown in FIG. 3J, a third dielectric layer 30, such as silicon nitride, with high viscosity is formed on the second dielectric layer 26 by use of a CVD method. Due to the high viscosity of the third dielectric layer 30 and tiny sizes of the plurality of small trenches 27, the third dielectric layer 30 during the formation cannot flow into the plurality of trenches 23, resulting in forming a plurality of air layers 28. After that, a fourth dielectric layer 31, such as silicon dioxide, is formed on the third dielectric layer 30, and then a CMP process is performed for the fourth dielectric layer 31. The FIG. 4 with the same reference numerals shows a brief perspective view of FIG. 3J.

Figure 3K:
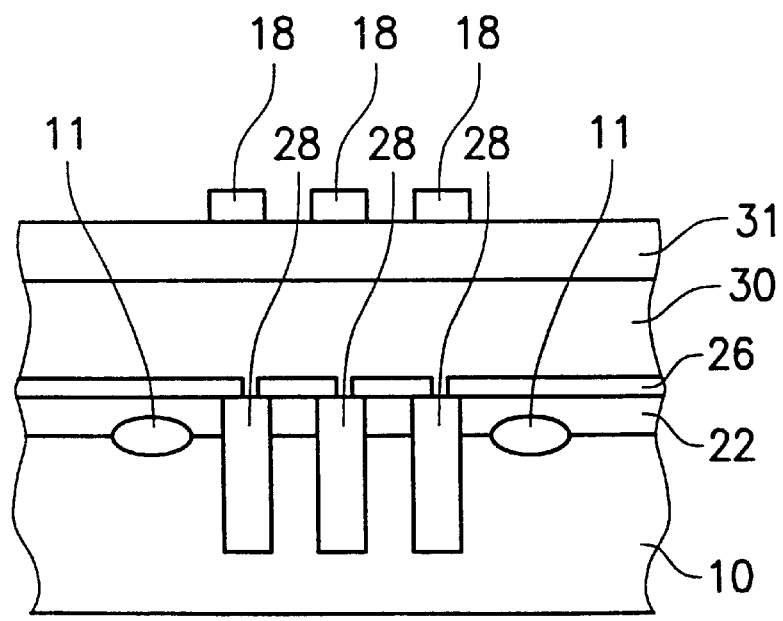
Figure 5:
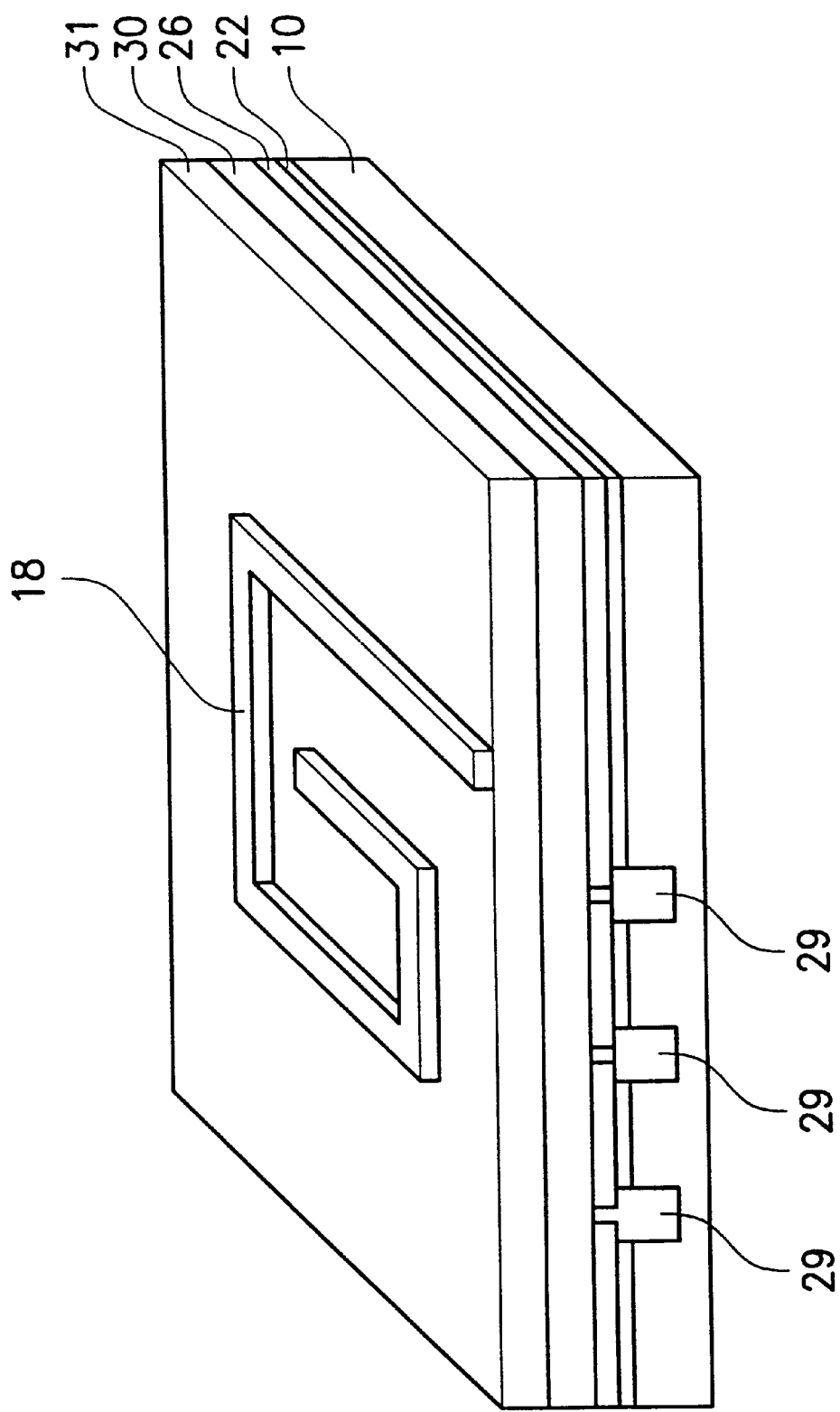
FIG. 5 is a perspective view illustrating a structure for manufacturing an inductor in semiconductor process according to a first embodiment of the invention.

Step 11:

As shown in FIG. 3K, a spiral metal layer 18, such as a spiral aluminum layer in square shape, is formed on the fourth dielectric layer 31 just above the trench-shaped air layers 28. FIG. 5 shows a perspective view of FIG. 3K.

Figure 6:
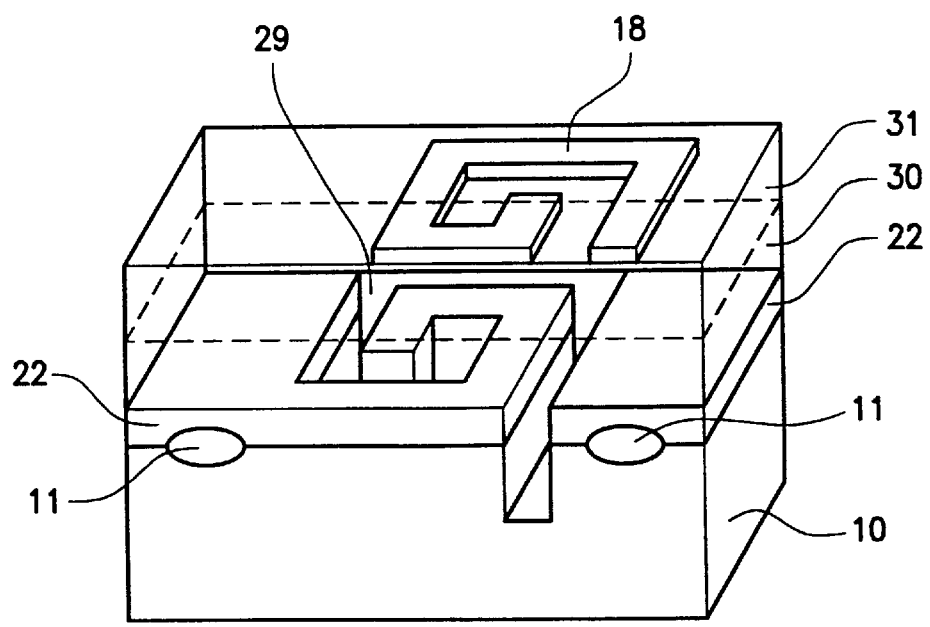
FIG. 6 is a perspective view illustrating a structure for manufacturing an inductor in semiconductor process according to a second embodiment of the invention.

Referring to FIG. 6, a perspective view of a structure for manufacturing an inductor with resonant frequency and Q value increased in semiconductor process according to a second embodiment of the invention is shown. The process of the second embodiment is approximately similar to that of the first embodiment. The main difference between them is that a spiral air layer 29 in square shape is formed in the second embodiment, in stead of the trench-shaped air layers in the first embodiment.

As described above, in a method for manufacturing an inductor with resonant frequency and Q value increased in semiconductor process according to the invention, there is/are (an) air layer(s) just under a spiral metal layer functioning as an inductor, and part of substrate material still remains around the air layer(s) for support of the spiral metal layer. Therefore, not only can this method in accordance with the invention increase the resonant frequency and Q value of the inductor, but also there is no disadvantage of causing the spiral metal layer easily to collapse as stated in the prior art.

Although the invention has been disclosed in terms of a preferred embodiment, the disclosure is not intended to limit the invention. Those knowledgeable in the art can make modifications within the scope and spirit of the invention which is determined by the claims below.

What is claimed is:

1. A method for manufacturing an inductor with resonant frequency and Q value increased in semiconductor process, comprising:

preparing a substrate on which a plurality of field oxide layers are already formed;

forming a first dielectric layer on said substrate and said plurality of field oxide layers;

performing a CMP process on said first dielectric layer;

forming a plurality of trenches in said first dielectric layer and said substrate between said field oxide layers;

forming a stuffing layer on said first dielectric layer and in said plurality of trenches;

performing a CMP process on said stuffing layer to remove part of said stuffing layer over said first dielectric layer, that is, remaining stuffing layers are still located only in said plurality of trenches;

forming a second dielectric layer on said first dielectric layer and said remaining stuffing layers;

forming a plurality of small trenches corresponding to said plurality of trenches on said second dielectric layer;

removing said remaining stuffing layers in said plurality of trenches;

forming a third dielectric layer with high viscosity on said second dielectric layer, wherein said third dielectric layer cannot flow into said plurality of trenches because of the high viscosity of said third dielectric layer and tiny sizes of said plurality of small trenches; and forming a spiral metal layer on said third dielectric layer just over said plurality of trenches.

2. A method for manufacturing an inductor with resonant frequency and Q value increased in semiconductor process as claimed in claim 1, further comprising:

forming a fourth dielectric layer on said third dielectric layer.

3. A method for manufacturing an inductor with resonant frequency and Q value increased in semiconductor process as claimed in claim 2, further comprising:

performing a CMP process for said fourth dielectric layer.

4. A method for manufacturing an inductor with resonant frequency and Q value increased in semiconductor process as claimed in claim 2, wherein said fourth dielectric layer is a silicon dioxide layer.

5. A method for manufacturing an inductor with resonant frequency and Q value increased in semiconductor process as claimed in claim 1, wherein said first dielectric layer, said second dielectric layer and said third dielectric layer are silicon dioxide layers.

6. A method for manufacturing an inductor with resonant frequency and Q value increased in semiconductor process as claimed in claim 1, wherein said plurality of trenches are formed by use of photolithography and plasma etching technologies.

7. A method for manufacturing an inductor with resonant frequency and Q value increased in semiconductor process as claimed in claim 1, wherein said plurality of small trenches are formed by use of photolithography and plasma etching technologies.

8. A method for manufacturing an inductor with resonant frequency and Q value increased in semiconductor process as claimed in claim 1, wherein said stuffing layer is a silicon nitride ($Si_3N_4$) layer.

9. A method for manufacturing an inductor with resonant frequency and Q value increased in semiconductor process as claimed in claim 8, wherein said remaining silicon nitride layers are removed by use of hot phosphatidic acid.

10. A method for manufacturing an inductor with resonant frequency and Q value increased in semiconductor process as claimed in claim 1, wherein said spiral metal layer is a spiral aluminum layer in square shape.

11. A method for manufacturing an inductor with resonant frequency and Q value increased in semiconductor process, comprising:

preparing a substrate on which a plurality of field oxide layers are already formed;

forming a first dielectric layer on said substrate and said plurality of field oxide layers;

performing a CMP process on said first dielectric layer;

forming a spiral trench in said first dielectric layer and said substrate between said field oxide layers;

forming a stuffing layer on said first dielectric layer and in said spiral trench;

performing a CMP process on said stuffing layer to remove part of said stuffing layer over said first dielectric layer, that is, a remaining stuffing layer is still located only in said spiral trench;

forming a second dielectric layer on said first dielectric layer and said remaining stuffing layer;

forming a small spiral trench corresponding to said spiral trench on said second dielectric layer;

removing said remaining stuffing layer in said spiral trench;

forming a third dielectric layer with high viscosity on said second dielectric layer, wherein said third dielectric layer cannot flow into said spiral trench because of the high viscosity of said third dielectric layer and tiny size of said small spiral trench; and forming a spiral metal layer on said third dielectric layer just over said spiral trench.

12. A method for manufacturing an inductor with resonant frequency and Q value increased in semiconductor process as claimed in claim 11, further comprising:

forming a fourth dielectric layer on said third dielectric layer.

13. A method for manufacturing an inductor with resonant frequency and Q value increased in semiconductor process as claimed in claim 12, further comprising:

performing a CMP process on said fourth dielectric layer.

14. A method for manufacturing an inductor with resonant frequency and Q value increased in semiconductor process as claimed in claim 12, wherein said fourth dielectric layer is a silicon dioxide layer.

15. A method for manufacturing an inductor with resonant frequency and Q value increased in semiconductor process as claimed in claim 11, wherein said first dielectric layer, said second dielectric layer and said third dielectric layer are silicon dioxide layers.

16. A method for manufacturing an inductor with resonant frequency and Q value increased in semiconductor process as claimed in claim 11, wherein said spiral trench is formed by use of photolithography and plasma etching technologies.

17. A method for manufacturing an inductor with resonant frequency and Q value increased in semiconductor process as claimed in claim 11, wherein said small spiral trench is formed by use of photolithography and plasma etching technologies.

18. A method for manufacturing an inductor with resonant frequency and Q value increased in semiconductor process as claimed in claim 11, wherein said stuffing layer is a silicon nitride ($Si_3N_4$) layer.

19. A method for manufacturing an inductor with resonant frequency and Q value increased in semiconductor process as claimed in claim 18, wherein said remaining silicon nitride layer in said spiral trench is removed by use of hot phosphatidic acid.

20. A method for manufacturing an inductor with resonant frequency and Q value increased in semiconductor process as claimed in claim 11, wherein said spiral trench is a spiral trench in square shape.

21. A method for manufacturing an inductor with resonant frequency and Q value increased in semiconductor process as claimed in claim 20, wherein said small spiral trench is a small spiral trench in square shape.

22. A method for manufacturing an inductor with resonant frequency and Q value increased in semiconductor process as claimed in claim 21, wherein said spiral metal layer is a spiral aluminum layer in square shape.

\* \* \* \* \*